US009277792B2

(12) United States Patent
Grotjohn et al.

(10) Patent No.: US 9,277,792 B2
(45) Date of Patent: Mar. 8, 2016

(54) MULTICOLORED SINGLE CRYSTAL DIAMOND GEMSTONES AND METHODS FOR FORMING THE SAME

(75) Inventors: Timothy A. Grotjohn, Okemos, MI (US); Carolyn Randall, Okemos, MI (US)

(73) Assignee: BOARD OF TRUSTEES OF MICHIGAN STATE UNIVERSITY, East Lansing, MI (US)

( * ) Notice: Subject to any disclaimer, the term of this patent is extended or adjusted under 35 U.S.C. 154(b) by 1100 days.

(21) Appl. No.: 13/215,326

(22) Filed: Aug. 23, 2011

(65) Prior Publication Data

US 2012/0047950 A1 Mar. 1, 2012

Related U.S. Application Data

(60) Provisional application No. 61/402,119, filed on Aug. 24, 2010.

(51) Int. Cl.
| | |
|---|---|
| *C30B 25/04* | (2006.01) |
| *A44C 17/00* | (2006.01) |
| *C30B 25/10* | (2006.01) |
| *C30B 29/04* | (2006.01) |
| *C30B 33/00* | (2006.01) |

(52) U.S. Cl.
CPC .............. *A44C 17/003* (2013.01); *C30B 25/105* (2013.01); *C30B 29/04* (2013.01); *C30B 33/00* (2013.01)

(58) Field of Classification Search
CPC ............ C30B 1/00; C30B 1/02; C30B 25/00; C30B 25/02; C30B 25/04; C30B 25/18; C30B 25/186; C30B 25/20; C30B 25/22; C30B 29/60; C30B 29/66; C30B 29/68; C30B 31/06; C30B 33/00; C30B 33/02; C30B 33/06

USPC ............. 117/84, 88–90, 92, 94–97, 103–105, 117/108, 928–929, 937, 942, 944–945, 117/950–951

See application file for complete search history.

(56) References Cited

U.S. PATENT DOCUMENTS

| | | | | |
|---|---|---|---|---|
| 4,809,417 | A | * | 3/1989 | Normann, Jr. .............. 29/896.41 |
| 5,443,032 | A | * | 8/1995 | Vichr et al. ..................... 117/84 |
| 5,980,119 | A | | 11/1999 | Furuyama |

(Continued)

OTHER PUBLICATIONS

D. T. Tran, et al. publication entitled "Microwave plasma-assisted etching of diamond," Diamond and Related Materials, vol. 17, pp. 717-721 (2008).*

(Continued)

*Primary Examiner* — Kenneth A Bratland, Jr.
(74) *Attorney, Agent, or Firm* — Marshall, Gerstein & Borun LLP (57) ABSTRACT

The disclosure relates to the inclusion of an image embedded in or on a single crystal diamond such that the image is part of the single crystal diamond structure. The disclosed methods use a combination of gemstone deposition processes and patterning processes to create single crystal gemstones with embedded color variations that can create externally visible two-dimensional or three-dimensional images in a seamless single crystal matrix without visible internal lines/interfacial boundaries. The image embedded image is differently colored from the surrounding diamond matrix. The color variation is accomplished by a change in the diamond growth conditions or treatment of the diamond.

20 Claims, 8 Drawing Sheets

(Example 1)

(56) References Cited

U.S. PATENT DOCUMENTS

| | | | |
|---|---|---|---|
| 6,025,060 A * | 2/2000 | Meissner | 428/220 |
| 7,128,974 B2 * | 10/2006 | Scarsbrook et al. | 428/408 |
| 7,172,957 B2 | 2/2007 | Namba et al. | |
| 2005/0127373 A1 | 6/2005 | Yokota et al. | |
| 2007/0212543 A1 * | 9/2007 | Twitchen et al. | 428/408 |
| 2008/0254570 A1 | 10/2008 | Kley | |
| 2009/0239078 A1 | 9/2009 | Asmussen et al. | |
| 2010/0013057 A1 | 1/2010 | D'Arrigo et al. | |
| 2010/0034984 A1 | 2/2010 | Asmussen et al. | |

OTHER PUBLICATIONS

T.W. Overton, and J.E. Shigley, "A History of Diamond Treatments," Gems and Gemology, Spring 2008, p. 32-52, 2008.

D.T. Tran, T.A. Grotjohn, D.K. Reinhard and J. Asmussen, "Microwave plasma-assisted etching of diamond," Diamond and Related Materials, 17, 717-721, 2008.

R. Ramamurti, M. Becker, T. Schuelke, T.A. Grotjohn, D.K. Reinhard, and J. Asmussen, "Synthesis of boron-doped homoepitaxial single crystal diamond by microwave plasma chemical vapor deposition," Diamond and Related Materials, 17, 1320-1323, 2008.

W. Smirnov, A. Kriele, D. Brink, W. Müller-Sebert, J. Hees, and C. Nebel, "Anisotropic etching of diamond by nano/micrometer sized Ni particles and their formation," Symposium J, MRS Fall 2009, Boston.

H. Kato, T. Makino, M. Ogura, N. Tokuda, H. Okushi, and S. Yamasaki, "Selective growth of buried n+ diamond on (001) phosphorus-doped n-type diamond film," Applied Physics Express 2 (2009) 055502-1-3.

H. Kato, D. Takeuchi, N. Tokuda, H. Umezawa, H. Okushi, S. Yamasaki, "Characterization of specific contact resistance on heavily phosphorus-doped diamond films," Diamond & Related Materials, 18 (2009), 782-785.

R. Ramamurti, M. Becker, T. Schuelke, T.A. Grotjohn, D.K. Reinhard, and J. Asmussen, "Deposition of thick boron-doped homoepitaxial single crystal diamond by microwave plasma chemical vapor deposition," Diamond and Related Materials, 18, 704-706, 2009.

D.T. Tran, C. Fansler, T.A. Grotjohn, D.K. Reinhard, and J. Asmussen, "Investigation of mask selectivities and diamond etching using microwave plasma-assisted etching," Diamond and Related Materials, 19, 778-782, 2010.

* cited by examiner

Figure 1 (Example 1)

Figure 2 (Example 2)

Figure 3 (Example 3)

Figure 4 (Example 4)

Figure 5 (Example 5)

Figure 6 (Example 6)

Figure 7 (Example 7)

Figure 8 (Example 8)

MULTICOLORED SINGLE CRYSTAL DIAMOND GEMSTONES AND METHODS FOR FORMING THE SAME

CROSS-REFERENCE TO RELATED APPLICATION

This application claims the benefit of U.S. Provisional Patent Application No. 61/402,119, filed Aug. 24, 2010, the disclosure of which is incorporated herein by reference in its entirety.

BACKGROUND OF THE DISCLOSURE

Field of the Disclosure

The disclosure relates to the inclusion of an image embedded in or on a single crystal gemstone (e.g., diamond) such that the image is part of the single crystal gemstone (e.g., diamond structure). The disclosed methods use a combination of gemstone deposition processes and patterning processes to create single crystal gemstones with embedded color variations that can create externally visible two-dimensional or three-dimensional images in a seamless single crystal matrix without visible internal lines/interfacial boundaries resulting from crystalline structure transitions. The embedded image is differently colored from the surrounding diamond matrix. The color variation is accomplished by a change in the diamond growth conditions or treatment of the diamond.

SUMMARY

This disclosure relates to the synthesis of single crystal diamond (e.g., by plasma-assisted chemical vapor deposition (PACVD)) with diamond of different colors and uses etching/patterning of the diamond to form customized diamond gemstones. The customization can be in the form of letters, numbers, symbols, or artistic patterns formed inside a single crystal diamond. The letters, numbers, symbols, shapes or artistic patterns have a color of diamond inside a colorless or different colored diamond crystal. The entire gemstone, including the inside colored diamond, is part of a single crystal diamond. An alternative technique is to grow the colored layer of diamond on top of a differently colored single crystal diamond and then etch the pattern on the top of the diamond gemstone.

Two patents relating to the inclusion of patterns or images in gemstones include U.S. Pat. Nos. 4,809,417 and 6,025,060. Both describe methods of putting images inside diamond by putting together two or more individual gemstones with adhesive or heat bonding techniques.

In contrast, the disclosed methods include forming a continuous single crystal gemstone that does not have any bonding or adhesive layer to join individual gemstones into a composite gemstone. The resulting gemstone formed according to the disclosure uses single crystal homoepitaxial deposition to form adjacent, differently colored layers (e.g., with one being colorless and one or more being colored) that together have single crystal structure, and further uses photolithography/etching techniques to define a pattern in one or more diamond layers that corresponds to the desired image in the final gemstone.

In an embodiment of the disclosure, a method for forming a multicolored single crystal gemstone (SCG) structure comprises: (a) providing a first SCG layer having (i) a growth surface and (ii) a first color; (b) removing a portion of the first SCG layer from the growth surface thereof, thereby forming a recess in the first SCG layer; (c) depositing a second SCG layer into the recess and optionally onto the growth surface of the first SCG layer, the second SCG layer having a second color different from the first color; (d) optionally removing a portion of the second SCG layer so that at least a portion of the second SCG layer remains in the recess as a patterned second SCG layer, thereby forming a multicolored SCG composite structure; (e) optionally depositing a third SCG layer having a third color above the patterned second SCD layer, thereby enlarging the multicolored SCG composite structure; and (f) optionally reshaping the multicolored SCG composite structure into a gemstone shape (e.g., where the multicolored SCG composite structure is stored for subsequent polishing/cutting into a gemstone shape at a later date). In an embodiment, the methods comprises depositing the third SCG layer in part (e), such as where the third color can be same as the first or the second color, or it can be different from both. In an embodiment, the method can comprise removing the portion of the second SCG layer deposited on the growth surface of the first SCG layer by one or more of polishing and etching the second SCG layer.

In another embodiment of the disclosure, a method for forming a multicolored single crystal diamond (SCG) structure comprises: (a) providing a first SCG layer having (i) a growth surface and (ii) a first color; (b) depositing a second SCG layer onto the growth surface of the first SCG layer, the second SCG layer having a second color different from the first color; (c) removing a portion of the either the first SCG layer or the second SCG layer to form a patterned first SCG layer or a patterned second SCG layer from the remaining layer material, thereby forming a multicolored SCG composite structure; (d) optionally depositing a third SCG layer having a third color above the patterned first SCG layer or the patterned second SCG layer, thereby enlarging the multicolored SCG composite structure; and (e) optionally reshaping the multicolored SCG composite structure into a gemstone shape (e.g., where the multicolored SCG composite structure is stored for subsequent polishing/cutting into a gemstone shape at a later date). In an embodiment, the methods comprises depositing the third SCG layer in part (d), such as where the third color can be same as the first or the second color, or it can be different from both. In another embodiment, part (c) can comprise removing a portion of the first SCG layer or second SCG layer by etching a bottom surface of the first SCG layer or a top surface of the second SCG layer to form the patterned first SCG layer or to form the patterned second SCG layer and to expose a portion of the first SCG layer or the second SCG layer respectively. In a variation of this method, parts (b) and (c) of the method can be combined such that a patterned second SCG layer (e.g., having the desired shape corresponding to all or a portion of the eventual embedded image) is deposited directly onto the growth surface of the first SCG layer (e.g., where a hard mask is deposited and patterned with a shape corresponding to the intended shape of the patterned second SCG layer such that the patterned hard mask serves as a deposition mask).

In another embodiment of the disclosure, a synthetic composite multicolored single crystal gemstone (SCG) comprises: (a) a first SCG layer having a first color; (b) a second SCG layer having a second color different from the first color, the second SCG layer being embedded within the composite multicolored SCG or being positioned at an external surface of the composite multicolored SCG; and (c) optionally a third SCG layer having a third color, the third SCG layer being positioned over one or more of the first SCG layer and the second SCG layer; wherein: (i) the first SCG layer, the second SCG layer, and the third SCG layer, when present, share the same single crystal structure; and (ii) optionally the composite multicolored SCG has a gemstone shape. (e.g., where the composite multicolored SCG structure has a shape generally resulting from the various deposition and etching/removal steps and is stored for subsequent polishing/cutting into a gemstone shape at a later date).

In another embodiment, the disclosure relates to a piece of jewelry comprising one or more synthetic composite multicolored single crystal gemstones (SCG) according to any of the various disclosed embodiments, The composite multicolored SCG can be mounted into the jewelry piece via any suitable setting (e.g., where the setting and other jewelry components are formed from or include a precious metal such as gold, silver, or platinum). The jewelry incorporating the composite multicolored SCG can be in any suitable form, such as a ring, earring, necklace, brooch, bracelet, etc.

Various embodiments of the disclosed methods and resulting synthetic gemstones are possible. Suitably, the single crystal gemstone layers are single crystal diamond (SCD) of various colors. The colors of any of the SCG layers can be independently selected from colorless, a color resulting from a deposition process including an impurity, and a color resulting from an irradiation process. The recess and the resulting patterned second SCG layer can have a shape selected from the group consisting of letters, numbers, words, symbols, and combinations thereof. Similarly, in the final gemstone-shaped structure, the second SCG layer defines an image externally visible with respect to the SCG gemstone, the image having a shape selected from the group consisting of letters, numbers, words, symbols, and combinations thereof. In an embodiment, the first SCG layer comprises an additional SCG layer embedded therein and having a color different from the first color. Depositing any of the SCG layers can comprise performing a chemical vapor deposition (CVD) process (e.g., a microwave plasma-assisted CVD (PACVD) process). In an embodiment, removing a portion of the first SCG layer can comprise performing an etching process on the first SCG layer, the etching process comprising: (i) depositing a hard mask on a portion of the growth surface of the first SCG layer; (ii) patterning the hard mask with a shape corresponding to the intended shape of the recess; (iii) etching the first SCG layer through the patterned hard mask to form the recess; and (iv) removing the hard mask. In an extension, this embodiment can further comprise depositing the second SCG layer in the recess and optionally depositing a fourth SCG layer with a fourth color in the recess prior to removing the hard mask (e.g., where the fourth color is same as the first or second colors, or different from both). Reshaping the multicolored SCG composite structure into a gemstone shape can comprise one or more of cutting and polishing the multicolored SCG composite structure to form the gemstone shape.

In an embodiment of the disclosure, a method for forming a multicolored single crystal diamond (SCD) structure comprises: (a) providing a first SCD layer having (i) a growth surface (e.g., a (100) surface) and (ii) a first color; (b) removing a portion of the first SCD layer from the growth surface thereof, thereby forming a recess in the first SCD layer; (c) depositing a second SCD layer into the recess and optionally onto the growth surface of the first SCD layer, the second SCD layer having a second color different from the first color; (d) optionally removing (e.g., polishing or etching) a portion of the second SCD layer so that at least a portion of the second SCD layer remains in the recess as a patterned second SCD layer (e.g., substantially coplanar with the growth surface of the first SCD layer, above the growth surface of the first SCD layer, or below the growth surface of the first SCD layer), thereby forming a multicolored SCD composite structure; (e) optionally depositing a third SCD layer above the patterned second SCD layer, thereby enlarging the multicolored SCD composite structure; and (f) reshaping (e.g., cutting, polishing) the multicolored SCD composite structure into a gemstone shape.

In another embodiment, a method for forming a multicolored single crystal diamond (SCD) structure comprises: (a) providing a first SCD layer having (i) a growth surface and (ii) a first color; (b) depositing a second SCD layer onto the growth surface (e.g., a (100) surface) of the first SCD layer, the second SCD layer having a second color different from the first color; (c) removing a portion of the either the first SCD layer or the second SCD layer to form a patterned first SCD layer or a patterned second SCD layer from the remaining layer material, thereby forming a multicolored SCD composite structure; (d) optionally depositing a third SCD layer above the patterned first SCD layer or the patterned second SCD layer, thereby enlarging the multicolored SCD composite structure; and (e) reshaping (e.g., cutting, polishing) the multicolored SCD composite structure into a gemstone shape.

Various modifications and extensions of the foregoing methods are possible. For example, providing the first SCD layer in part (a) can comprise depositing the first SCD layer on an existing SCD substrate. The first SCD layer can comprise an additional SCD layer embedded therein and having a color different from the first color. The deposition of any of the first SCD layer, the second SCD layer, and/or the third SCD layer can comprise performing a diamond chemical vapor deposition (CVD) process (e.g., a microwave plasma-assisted CVD process). The first color, the second color, and the third color can be independently selected from colorless, a color resulting from a SCD deposition process including an impurity, and a color resulting from a SCD irradiation process. The recess, patterned first SCD layer, and/or patterned second SCD layer can have a shape selected from the group consisting of letters, numbers, words, symbols, and combinations thereof. Removing portions of the various SCD layers can include performing an etching process thereon (e.g., (i) depositing a hard mask on the growth surface of the SCD layer; (ii) patterning the hard mask with a shape corresponding to the intended shape of the recess or patterned SCD layer; (iii) etching the SCD layer through the patterned hard mask to form the recess patterned SCD layer; and (iv) removing the hard mask). When included, the third color can be the same as the first or second color, or it can be different from both the first and second color.

In another embodiment, the disclosure relates to a multicolored single crystal diamond (SCD) gemstone formed by any of the foregoing methods and/or having a structure corresponding to the structure resulting from any of the foregoing methods (e.g., a single crystal gemstone matrix having at least one region differently colored from other regions of the matrix, the differently colored region being in the shape of a desired image and having the same single crystal structure as the matrix).

The disclosure also relates more generally to methods for forming single crystal gemstone (SCG) structures from materials other than single crystal diamond and to the resulting SCG structures.

In an embodiment, a method for forming a multicolored single crystal gemstone (SCG) structure comprises: (a) providing a first SCG layer having (i) a growth surface and (ii) a first color; (b) removing a portion of the first SCG layer from the growth surface thereof, thereby forming a recess in the first SCG layer; (c) depositing a second SCG layer into the recess and optionally onto the growth surface of the first SCG layer, the second SCG layer having a second color different from the first color; (d) optionally removing a portion of the second SCG layer so that at least a portion of the second SCG layer remains in the recess as a patterned second SCG layer, thereby forming a multicolored SCG composite structure; (e) optionally depositing a third SCG layer above the patterned second SCG layer, thereby enlarging the multicolored SCG composite structure; and (f) reshaping the multicolored SCG composite structure into a gemstone shape.

In another embodiment, a method for forming a multicolored single crystal gemstone (SCG) structure comprises: (a) providing a first SCG layer having (i) a growth surface and (ii) a first color; (b) depositing a second SCG layer onto the growth surface of the first SCG layer, the second SCG layer having a second color different from the first color; (c) removing a portion of the either the first SCG layer or the second SCG layer to form a patterned first SCG layer or a patterned second SCG layer from the remaining layer material, thereby forming a multicolored SCG composite structure; (d) optionally depositing a third SCG layer above the patterned first SCG layer or the patterned second SCG layer, thereby enlarging the multicolored SCG composite structure; and (e) reshaping the multicolored SCG composite structure into a gemstone shape.

The various modifications and extensions described above in relation to multicolored SCD structures and gemstones also apply to the more general multicolored SCG methods and structures.

In another embodiment, the disclosure relates to a multicolored single crystal gemstone (SCG) formed by any of the foregoing methods and/or having a structure corresponding to the structure resulting from any of the foregoing methods.

All patents, patent applications, government publications, government regulations, and literature references cited in this specification are hereby incorporated herein by reference in their entirety. In case of conflict, the present description, including definitions, will control.

Additional features of the disclosure may become apparent to those skilled in the art from a review of the following detailed description, taken in conjunction with the drawings, examples, and appended claims.

BRIEF DESCRIPTION OF THE DRAWINGS

For a more complete understanding of the disclosure, reference should be made to the following detailed description and accompanying drawings wherein:

FIGS. 1-8 illustrate various processes (and resulting products) for forming synthetic multicolored single crystal diamond gemstones according to various embodiments of the disclosure.

FIGS. 1-5 show side views (left) and top views (right) of the gemstone structures during the illustrated processes to impart a visible embedded image into a gemstone matrix.

While the disclosed compositions and methods are susceptible of embodiments in various forms, specific embodiments of the disclosure are illustrated in the drawings (and will hereafter be described) with the understanding that the disclosure is intended to be illustrative, and is not intended to limit the claims to the specific embodiments described and illustrated herein.

DETAILED DESCRIPTION

The present disclosure relates to the inclusion of an image embedded in or on a single crystal diamond such that the image is part of the single crystal diamond structure. The disclosed methods use a combination of gemstone deposition processes and patterning processes to create a synthetic single crystal gemstones with embedded color variations that can create externally visible two-dimensional or three-dimensional images in a seamless single crystal matrix without visible internal lines/interfacial boundaries. The embedded image can be differently colored from the surrounding diamond matrix. The color variation is accomplished by a change in the diamond growth conditions or treatment of the diamond. The change in the growth conditions can include the addition of impurities to the diamond growth process to make the diamond a different color. Such impurities can make the diamond blue, brown, or black, for example. Other colors can be formed by irradiation treatment of the diamond to form green, pink, and red colors, for example. Other colors could also be created by forming adjacent layers of different colors; for example, a violet color can be created by starting with a red colored diamond and adding a blue layer of diamond on top. The resulting single crystal gemstones can be used in jewelry and other decorative applications.

The deposition processes generally include the homoepitaxial growth of layers of single crystal gemstone ("SCG") material of multiple (different) colors onto a substrate/seed (which may or may not form part of the ultimate gemstone). A single layer of the SCG material can be a colorless material (e.g., colorless diamond), a single color, or of various colors. Suitable substrate/seed materials can include a high-pressure, high-temperature ("HPHT") Single Crystal Diamond ("SCD") seed or a SCD layer previously grown on and removed from an HPHT seed. While the general description and illustrative examples relate to deposition processes for SCD, the methods herein can be used to form SCGs from materials other than diamond. For example, other possible gemstone materials that can be deposited in a layered manner to form images inside a SCG material include aluminum oxide materials (e.g., ruby, sapphire), silicon carbide materials (e.g., moissanite), and garnets (e.g., represented by $X_3Y_2(SiO_4)_3$, where X can be a divalent metal cation (such as $Ca^{2+}$, $Mg^{2+}$, and/or $Fe^{2+}$) and Y can be a trivalent metal cation (such as $Al^{3+}$, $Fe^{3+}$, and/or $Cr^{3+}$) in an octahedral/tetrahedral framework with $[SiO_4]^{4-}$ occupying the tetrahedral) Thus, as used herein, references and processes related to "diamond" or "single crystal diamond" can be more generally interpreted as more broadly applying to SCGs from other such materials.

Suitable deposition processes for SCG or SCD generally include chemical vapor deposition ("CVD") processes, for example, (microwave) plasma-assisted chemical vapor deposition ("PACVD") processes. Example PACVD processes for the homoepitaxial growth of colorless, near colorless, and impurity-colored single crystal diamond can be found in U.S. Publication Nos. 2009/0239078 and 2010/0034984 (references 1 and 2 below), incorporated herein by reference. The deposition of colorless/clear SCD is suitably achieved with source gases such as a carbon source such as $CH_4$ or other hydrocarbon, with hydrogen source such as $H_2$, and with an optional diluent gas such as Ar. The deposition of colored diamond including blue, brown, yellow, and black can be accomplished by adding impurities to the deposition source gases (i.e., in addition to the hydrogen and carbon/hydrocarbon source gases). Blue diamond is deposited by adding boron to the PACVD deposition process for the diamond deposition. Brown or yellow is obtained by adding nitrogen to the PACVD diamond deposition process (at varying nitrogen concentrations and CVD growth conditions). Black is achieved by adding boron and/or nitrogen in higher concentrations in the PACVD process. Suitable irradiation treatments for creating additional colors such as green, pink, and red are described in Overton et al., "A History of Diamond Treatments" (reference 3 below), incorporated herein by reference in its entirety.

A single layer of the SCG material can be a colorless material (e.g., colorless diamond), a single color, or of multiple colors such that adjacent layers (e.g., layers formed by sequential deposition processes) are visibly distinct as having different colors. A SCG layer having a single color can have a homogeneous color distribution or a varying gradient distribution, For example, the single color can vary in spatial intensity throughout the layer (e.g., various shades of blue or brown as a function of position in the layer) such as where a dopant concentration varies spatially in the layer (e.g., resulting from a time-dependent variation in the feed gas dopant concentration during SCG/SCD deposition of the layer so that the shade varies in the direction of layer growth). In another embodiment, the SCG layer can have a varying spatial blend of two of more different colors throughout the layer, for example resulting from independent variation of two or more dopant concentrations during deposition (e.g., spatial transition from blue to brown based on an initially high boron dopant concentration that decreases over time (e.g., to zero) and an initially low/zero nitrogen dopant concentration that increases over time; spatial transition from yellow to brown based on varying the nitrogen dopant concentration that increases versus time).

The processes for patterning/reshaping a SCD at various stages of a fabrication process can be similar to those used in microelectronics and microelectromechanical systems ("MEMS") fabrication (e.g., etching/photolithography techniques) as well as conventional gemstone cutting and polishing techniques. For example, the patterning of the SCD can be performed using diamond plasma-assisted etching in combination with photolithography techniques to define a pattern appropriate for the final desired gemstone shape and image shapes embedded therein. Suitable plasma-assisted etching techniques can include (i) the deposition of a hard mask material (e.g., Al, Ti, Au, $SiO_2$, $Si_3N_4$) onto a SCD substrate to be patterned, (ii) the patterning of the hard mask with a photoresist (e.g., patterned with liftoff and/or etching techniques), (iii) etching of the exposed SCD substrate (e.g., isotropic or anisotropic etching to form correspondingly shaped trenches/recesses, isotropic microwave plasma-assisted dry etching using $Ar/O_2$ etch gases with optional $SF_6$), and (iv) removal of the hard mask. Optionally, one or more additional SCD layers or one or more colors (e.g., same or different from the etched SCD substrate) can be deposited into the etched SCD substrate trench (i.e., use of the hard mask as deposition mask as well as an etching mask). The Tran et al. publications (references 4 and 5) illustrate such plasma-assisted etching techniques as well as hard mask patterning techniques and are incorporated herein by reference in their entireties. The depth of the etching is controlled by how long the etching process is performed. Typical etch rates can vary from less than 1 to over 10 microns per hour for single crystal diamond.

In another embodiment, the etched pattern or recess in the diamond surface that serves as the template for the eventual embedded image can be formed by a laser that ablates the desired pattern in the diamond by removing a layer of diamond where the laser beam hits the diamond (e.g., in a preselected pattern or recess corresponding to the image shape). The etched pattern also can be formed by a focused ion beam. Thus, the laser or ion beam can replace the masking and plasma etching steps. The laser is focused to ablate the diamond in the locations where an etching process would normally be applied to remove a layer of diamond in the localized region. After the laser ablation, a cleaning process (such as a hydrogen plasma clean) can be performed to prepare the surface for subsequent diamond deposition.

FIGS. 1 to 8 generally illustrate specific example embodiments of the above general processes used to form a resulting multicolored SCD structure 140, a multicolored SCD gemstone 142, and/or a SCD having an image/pattern 126 embedded within the SCD structure 140/142. Note that the lines showing the interface/boundary between different layers in the figures are for illustrative purposes and are not visible in the actual gemstone. Specifically, the formed gemstones have a single crystal structure, so boundaries between layers formed by different process steps are not visible; only boundaries defined by gradients/changes in color are externally visible.

Figure 1:
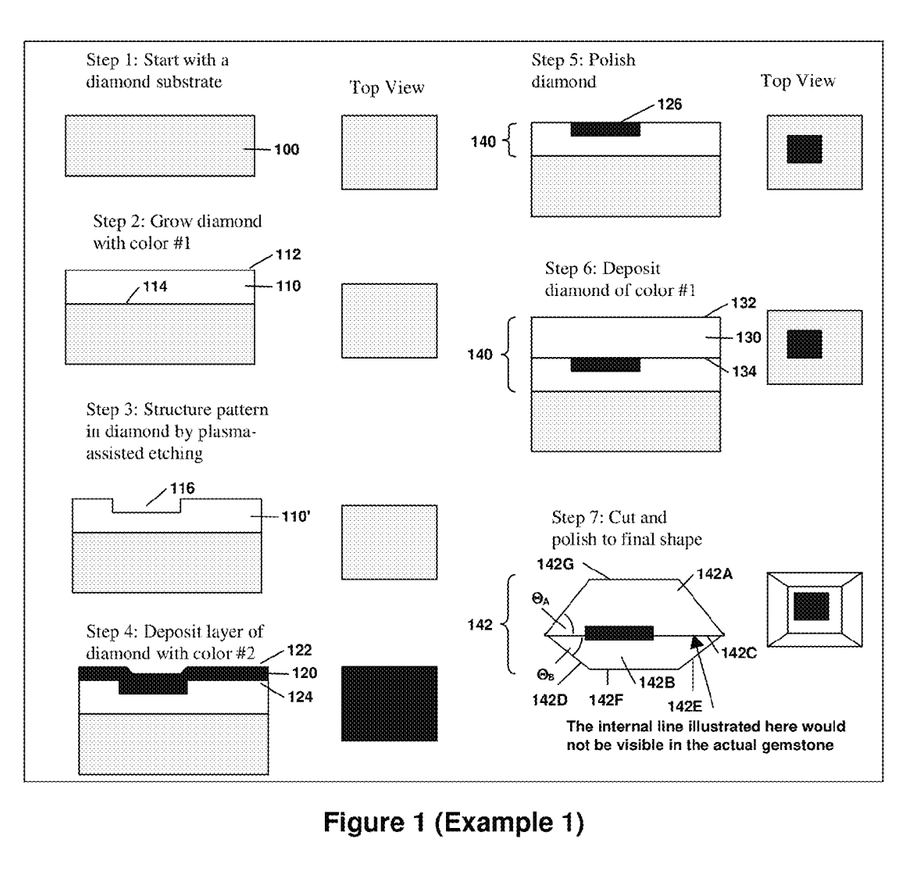
Figure 3:
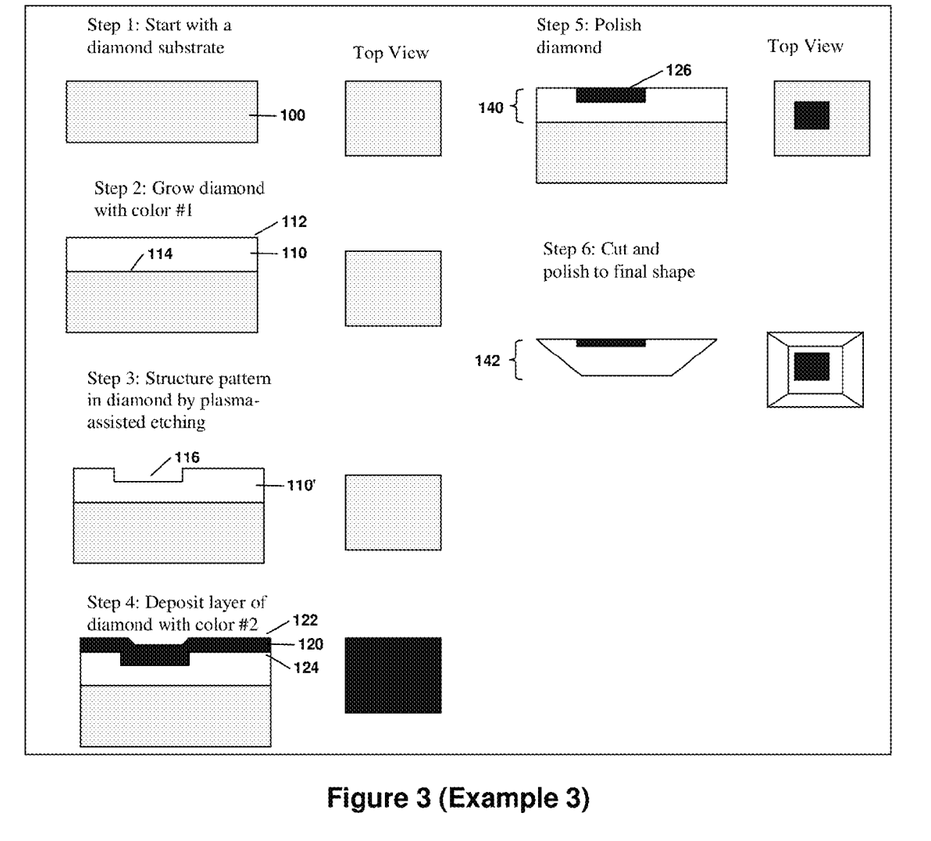

FIGS. 1 and 3 illustrate methods for forming a synthetic multicolored SCD structure 140 and gemstone 142 which may include an embedded image and/or unique pattern. The methods generally include: (a) providing a first SCD layer 110 having (i) a growth surface 112 (e.g., a (100) crystal surface; generally illustrated as a top surface 112 opposing a bottom surface 114) and (ii) a first color; (b) removing a portion of the first SCD layer 110 from the growth surface 112 thereof, thereby forming a recess 116 in the first SCD layer 110; (c) depositing a second SCD layer 120 into the recess 116 and optionally onto the growth surface 112 of the first SCD layer 110, the second SCD layer 120 having a second color different from the first color; (d) optionally removing a portion of the second SCD layer 120 so that at least a portion of the second SCD layer 120 remains in the recess 116 as a patterned second SCD layer 126, thereby forming a multicolored SCD composite structure 140; (e) optionally depositing a third SCD layer 130 above the patterned second SCD layer 126, thereby enlarging the multicolored SCD composite structure 140 (e.g., included step in FIG. 1 and omitted in FIG. 3); and (f) reshaping the multicolored SCD composite structure 140 into a gemstone shape 142. Typically the first layer 110 is deposited and grown on a diamond substrate 100. The substrate 100 layer can ultimately be removed to provide the composite structure 140 or the final gemstone 142 (e.g., by reshaping before or after removal from the substrate 100). The optional third SCD layer 130 defines a third color which can be colorless, a unique color different from both the first and second layers 110 and 126 or identical to one of the first and second layers 110 and 126. In a further embodiment, the first layer 110, second layer 126 and third layer 130 each define a unique shade of a similar color. For example, the first layer is light blue, the second layer is dark blue and the third layer is again light blue.

Figure 2:
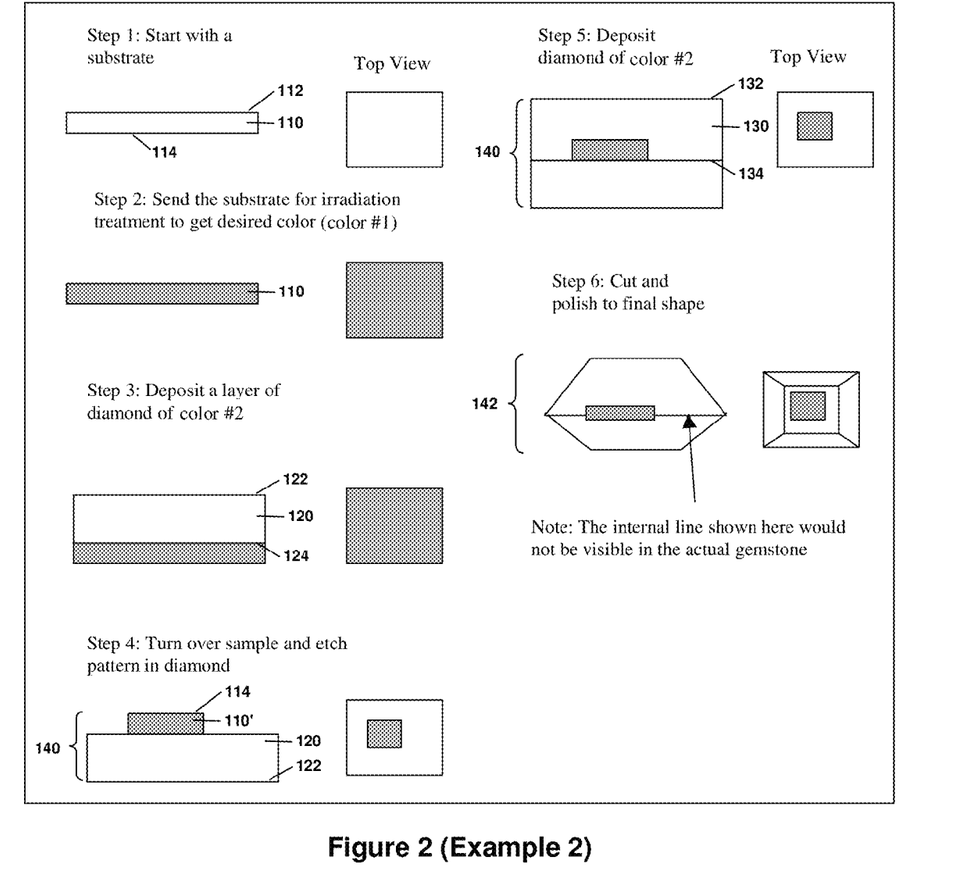
Figure 4:
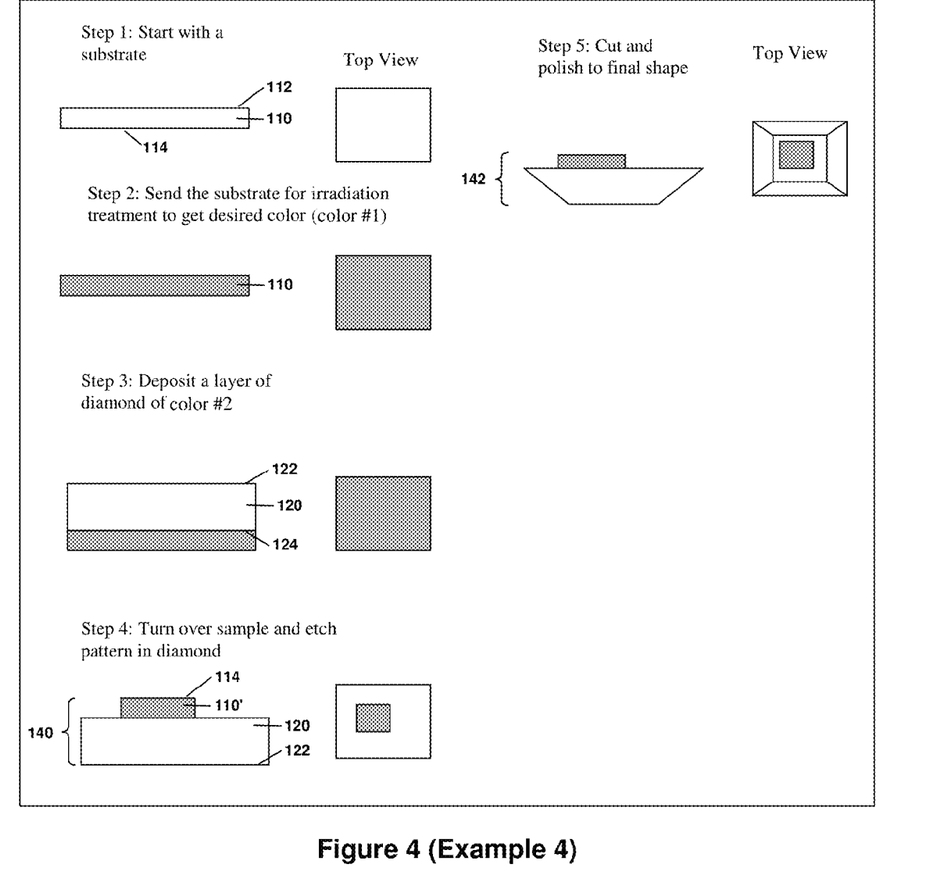
Figure 5:
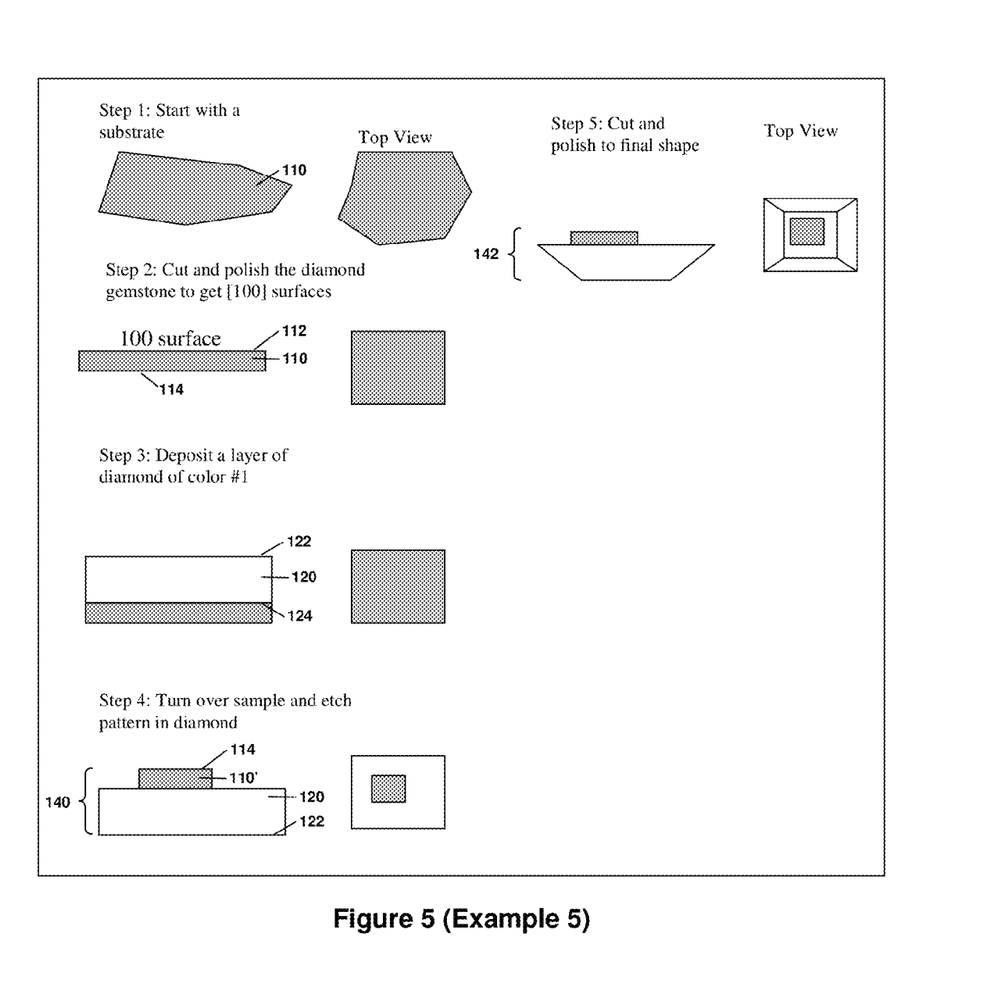
Figure 7:
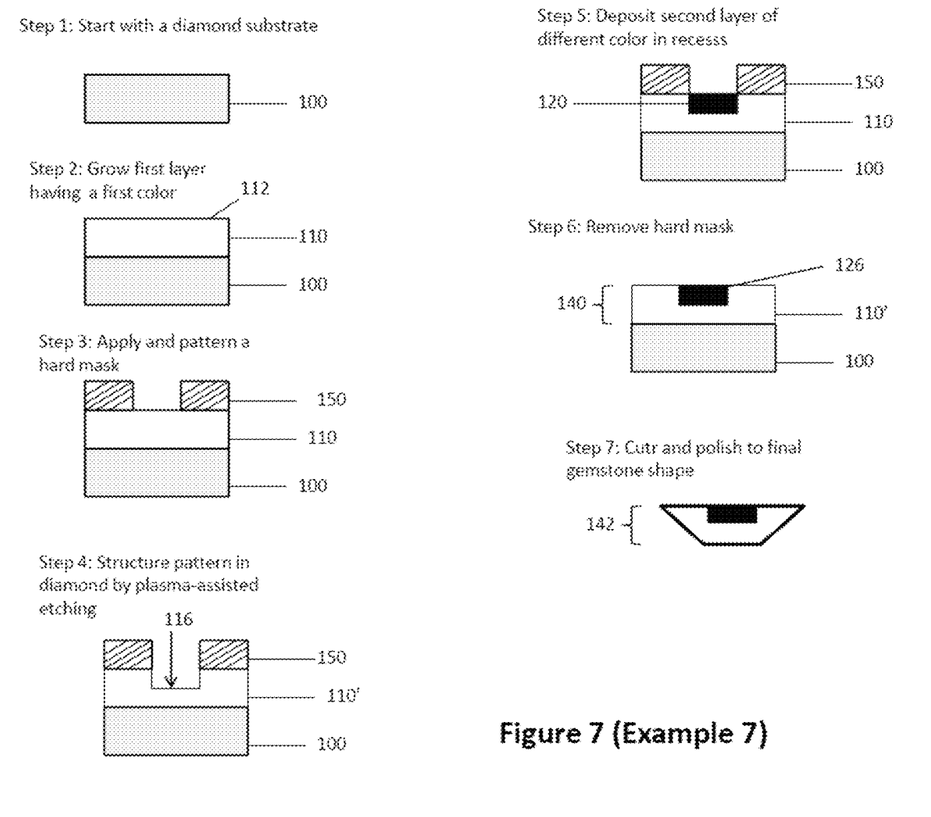
FIGS. 7 and 8 show side views of the gemstone structures during additional process embodiments to impart a visible embedded image into a gemstone matrix.
Figure 8:
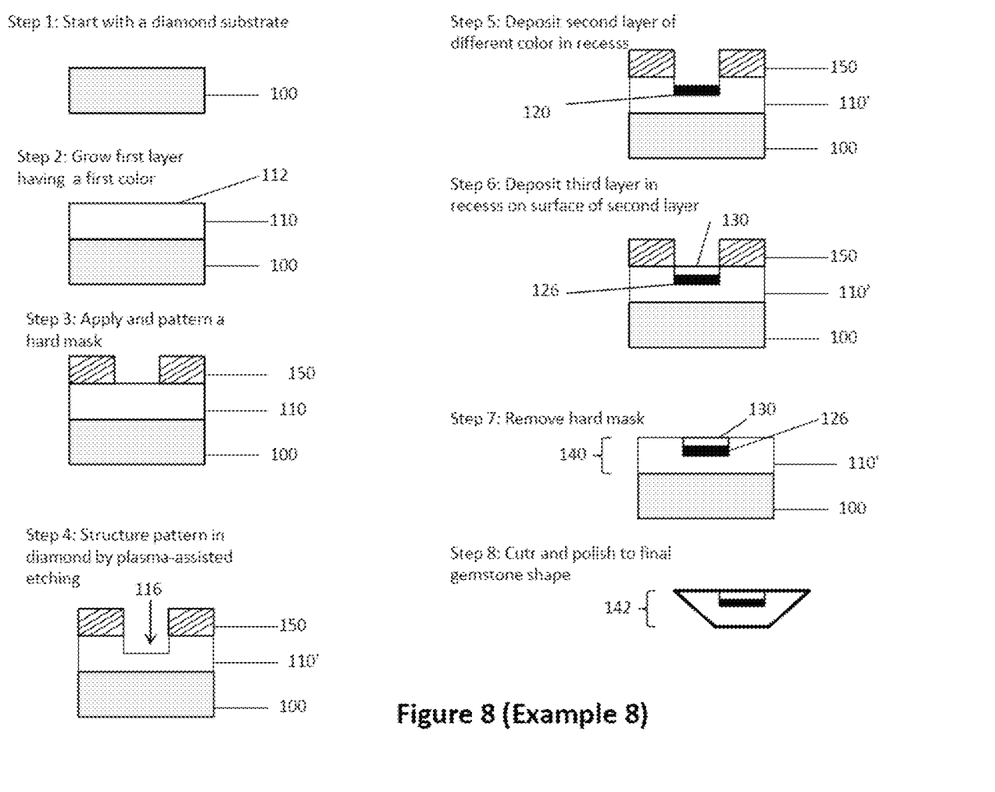

The disclosure further relates to multicolored SCD gemstones 142 as represented by the final product of the disclosed methods and as illustrated by the specific methods shown in the figures. As shown in FIG. 1, the SCD gemstone 142 having a suitable gemstone shape includes a first SCD layer 110 (e.g., etched layer 110' with a recess and eventually polished/cut into the gemstone 142 shape) having a first color, a second SCD layer 126 (e.g., a patterned layer 126 in the shape of all or a portion of a desired visible image) having a second color different from the first color, and a third SCD layer 130 (e.g., a layer over one or both of the first SCD layer 110 and the second SCD layer 126 and eventually polished/cut into the gemstone 142 shape) having a third color (e.g., different from both the first and second colors or the same as one of the first or second colors). The various SCD layers present in the gemstone 142 share the same crystal structure such that the gemstone 142 includes an externally visible two-dimensional or three-dimensional image in a seamless single crystal matrix without visible internal lines/interfacial boundaries resulting from crystalline structure transitions (i.e., a visible distinction, if any, between the layers results from a color transition). Distinct layers in the gemstone are distinguished by color change boundaries that can result from a change in local dopant concentration across the boundary or differences in irradiation treatment history of localized regions of the gemstone 142, but not by discontinuous changes in the crystalline structure within the gemstone 142. As illustrated in FIGS. 1, 2, and 8, the second SCD layer 126 forming all or a portion of the eventual visible image is completely embedded within the SCD gemstone (e.g., embedded within the first SCD layer 110 or embedded between the first and third SCD layers 110, 130). As illustrated in FIGS. 3 and 7, the second SCD layer 126 can be partially embedded in the gemstone 142 (e.g., portions within or adjacent to the first SCD layer 110 as shown) and still have one or more surfaces positioned at an external surface of the gemstone 142. As illustrated in FIGS. 4 and 5, the second SCD layer 110' can be positioned at an external surface of the SCD gemstone 142 (e.g., having been formed on the first SCD layer 110 but not fully or partially embedded therein).

FIGS. 1, 3, 7 and 8 illustrate embodiments according to methods of the present disclosure. FIGS. 1 and 3 illustrate an aspect of the above embodiment that includes the removal of a portion of the second SCD layer 120 in part (d) of the method (step 5 in the Figures). In the illustrated method of FIGS. 1 and 3, the hard mask (not shown) used to etch the first SCD layer 110 and form the recess 116 is removed prior to deposition of the second SCD layer 120 above the etched first SCD layer 110. In this case, second SCD layer 120 is deposited both in the recess 116 and at least partially on the original growth surface 112 of the first SCD layer 110. The portion of the second SCD layer 120 on the original growth surface 112 is removed (e.g., by polishing, etching) before reaching the final composite structure 140/142. In alternate aspects, as shown in FIGS. 7 and 8, it is possible to omit part (d) (i.e., the removing of the portion of the second SCD layer 120 from the growth surface 112), for example by leaving a hard mask 150 used to etch the recess 116 on the first SCD layer 110 and then growing/depositing the second SCD layer 120 only in the recess 116 (i.e., the hard mask 150 serves both as an etching mask and a deposition mask before being removed). In this case, the basic multicolored SCD composite structure 140 is formed after part (c) of the method (i.e., deposition of the second SCD layer) and removal of the hard mask. As a further refinement as shown in FIG. 8, it is possible to: (i) etch a deep trench recess 116 in the first SCD layer 110 using the hard mask 150, (ii) leave the hard mask 150 on the growth surface 112 of the first SCD layer 110, (iii) partially fill the recess 116 with the deposited second SCD layer 120, (iv) fill the remaining portion of the recess 116 with a third SCD layer 130 (e.g., having the same or different color as the first SCD layer 110, (v) remove the hard mask 150, and (vi) cut/polish the composite structure 140 to form the gemstone 142.

FIGS. 2, 4, and 5 illustrate additional methods for forming a synthetic multicolored SCD structure 140 and gemstone 142. The methods generally include: (a) providing a first SCD layer 110 having (i) a growth surface 112 and (ii) a first color; (b) depositing a second SCD layer 120 onto the growth surface 112 of the first SCD layer 110, the second SCD layer 120 having a second color different from the first color; (c) removing a portion of the either the first SCD layer 110 or the second SCD layer 120 to form a patterned first SCD layer 110' or a patterned second SCD layer (not shown) from the remaining layer material, thereby forming a multicolored SCD composite structure 140; (d) optionally depositing a third SCD layer 130 above the patterned first SCD layer 110' or the patterned second SCD layer, thereby enlarging the multicolored SCD composite structure 140 (e.g., included in FIG. 2 and omitted in FIGS. 4 and 5); and (e) reshaping the multicolored SCD composite structure 140 into a gemstone shape 142.

In one aspect of the foregoing embodiment, part (c) of the method (i.e, removing a portion of the either the first SCD layer 110 or the second SCD layer 120 to form a patterned first SCD layer 110' or a patterned second SCD layer from the remaining layer material, thereby forming a multicolored SCD composite structure 140) includes removing a portion of the first SCD layer 110 by etching a bottom surface of the first SCD layer 110 to form the patterned first SCD layer 110 and to expose a portion of a bottom surface 124 of the second SCD layer 120 (i.e., as shown in FIGS. 2, 4, and 5, the composite structure shown in step 3 of the figures is turned over to allow etching of the first SCD layer 110). In another aspect of the foregoing embodiment, part (c) of the method includes removing a portion of the second SCD layer 120 by etching a top surface 122 of the second SCD layer 120 to form the patterned second SCD layer and to expose a portion of the growth surface 112 of the first SCD layer 110 (i.e., an alternative to the embodiment shown in FIGS. 2, 4, and 5 in which the composite structure shown in step 3 of the figures need not be turned over to allow etching of the second SCD layer).

In any of the foregoing embodiments, the inclusion of the third SCD layer 130 having a top surface 132 and a bottom surface 134 is optional depending on the desired spatial location of the embedded image (e.g., as represented by the patterned second SCD layer 126 or the patterned first SCD layer 110' in the figures) in the final gemstone 142. As shown in FIGS. 1, 2, and 8 inclusion of the third SCD layer 130 can result in the embedded image and/or unique color pattern being spatially located in the interior of the gemstone 142. As shown in FIGS. 3-5 and 7, omission of the third SCD layer 130 can result in the embedded image being spatially located at the exterior of the gemstone 142 (e.g., embedded into and substantially flush with the exterior gemstone surface as in FIG. 3, or positioned on the exterior gemstone surface as in FIGS. 4, 5, and 7).

The present disclosure provides for formation of a composite SCD structure formed by a plurality of layers and having an embedded image or pattern. At least one of the layers defines a unique color relative to the others. In an example, a four layer or more SCD composite is formed according to the methods described above. The multilayer composite can have multiple images or colored layers providing a variety of externally visible desired images.

As indicated above, any of the various SCD layers can be formed with a CVD process. The thickness of an individual layer (e.g., length scale in the growth direction of the SCD layer) will depend on the deposition time and can be suitably selected based on the desired shape/size parameters of the resulting gemstone 142 and embedded images 126/110'. For example, the first SCD layer 110 and third SCD layer 130 (if present) should be grown thick enough to permit cutting of the desired gemstone shape. The thickness may be as large as several millimeters (e.g., up to 1 mm, 2 mm, 3 mm, 4 mm, 5 mm, 7 mm, 10 mm) for larger gemstone cuts. If the gemstone is more of a flat cut so that the light passes through the gemstone, thinner layers with a thickness large enough to provide sufficient strength against breaking (e.g., at least 0.1 mm, 0.2 mm, 0.3 mm, 0.4 mm, 0.5 mm, 0.6 mm, 0.8 mm). The thickness of the second SCD layer 120 is suitably selected based on the desired depth of color (i.e., thicker layers provide a deeper color, with thicknesses generally ranging from less than 1 µm to greater than 100 µm possible; possible subranges include at least 0.5 µm, 1 µm, 2 µm, 5 µm, 10 µm, 20 µm, 50 µm, or 100 µm and/or up to 10 µm, 20 µm, 50 µm, 100 µm, 200 µm, or 500 µm). Relatively thin second SCD layers 120 are suitable when the embedded image is essentially a two-dimensional image (i.e., having a thickness relatively small relative to the image length scales in the two coordinate directions orthogonal to the thickness direction). Relatively thicker second SCD layers 120 (e.g., greater than 100 µm) are suitable when the embedded image is desirably a three-dimensional image having substantial length scales in all three directions/dimensions.

In the disclosed methods, etching/patterning processes are used to create desired shapes/regions within a SCD matrix that have a color difference with the matrix (e.g., colored vs. colorless, two or more different colors), and the internal shapes/regions are selected to provide a desired image externally visible from the gemstone (e.g., preferably visible to the naked eye, but possibly invisible to the naked eye but detectable with optical enhancement devices such as microscopes). In the embodiment illustrated in FIGS. 1 and 3, the recess 116 is etched with a shape corresponding to the desired image so that the eventual patterned second SCD layer 126 has the shape of the desired embedded image. In the embodiment illustrated in FIGS. 2, 4, and 5, the first SCD layer 110 is etched so that the resulting patterned first SCD layer 110' has the shape of the desired embedded image. In general, any combination of these two methods can be used to provide (i) multiple embedded images in a single gemstone, and/or (ii) a composite image formed by two or more adjacent deposited SCD layers (e.g., having different colors to provide a single externally visible composite color and/or having different cross-sectional shapes in adjacent planes/layers normal to the growth direction, thus permitting the growth of complex three-dimensional embedded images).

The image that can be placed into the diamond is not particularly limited and could be letters, numbers, symbols, or artistic patterns. Specific examples include but are not limited to: letters and/or numerals (e.g., English, Greek, Arabic, Roman, others), words (e.g., Love, Peace, Hope, Faith, Family, Dream, Life, Live), symbols (e.g., Greek letters, smiley face, yin/yang, cross, Star of David, Celtic cross, crescent and star, star, Christian fish, 6-pointed star, 8-pointed star, dove, bird, eagle, cat, dog, spider, spider web, heart, heart with arrow, cupid, sun, moon, peace symbol, wolf howling, rose, daisy, other flowers, butterfly, shamrock, Egyptian ankh, collegiate logo, football, basketball, baseball and/or bat, tennis racket with ball, golf club and ball, motorcycle, bicycle, skis, skates, other sports symbols, snowflake, planet Earth, planet with ring, guitar, tree, lighthouse, diamond, boat/ship, dolphin, whale, Zodiac sign, Chinese Zodiac symbols), and combinations thereof.

The particular shape of the gemstone 142 (i.e., shape of the gemstone 142 exterior with all of its component layers/colors) is not particularly limited and can include any shape desired. Suitable gemstone cuts include: Antwerp rose cut, baguette cut, Barion cut, brilliant cut, briolette cut, cabochon cut, cushion or old mine cut, double Dutch rose cut, emerald cut, Flanders cut, heart brilliant cut, king brilliant cut, kite brilliant cut, lozenge cut, magna brilliant cut, marquise or navette cut, obus cut cut, oval brilliant cut, pear or drop brilliant cut, pendeloque cut, princess cut, radiant cut, rose or rosette cut, round brilliant cut, single or eight cut, step cut, square emerald cut, star brilliant cut, trapezoid or trapeze cut, trilliant or trillion or triangle cut.

In various embodiments, the gemstone shape can be faceted (e.g., having a plurality of planar external surfaces to promote light reflection and brilliance of the gemstone, such as any of the various brilliant cuts) or non-faceted (e.g., having a smooth outer surface such as rounded and/or elliptical surfaces characteristic of a cabochon cut). FIG. 1 illustrates a faceted gemstone 142, which generally includes a crown portion 142A (e.g., a top portion generally intended to be viewed and/or extending outwardly away from an intended mounting position) and an opposing pavilion portion 142B (e.g., a bottom portion generally intended for mounting of the gemstone such as in a setting). The pavilion portion 142B cross section has surfaces 142D, 142E, and 142F. In many gemstone cuts, the surfaces 142D and 142E are longer than 142F, such that 142D and 142E come to a point or almost a point with the 142F surface being very small (e.g., a culet surface, which can be parallel to an opposing table surface 142G on the crown portion 142A) or nonexistent. The gemstone can further include a girdle portion 142C positioned between the crown 142A and the pavilions 142B. The girdle 142C can be present as a thin portion extending slightly in the height direction of the gemstone 142 (e.g., having a height less than about 5%, 2%, or 1% of the total gemstone height) or it can be present as a plane dividing the crown 142A and the pavilions 142B (e.g., essentially having no three dimensional shape, as illustrated in the figure). The designation of the three gemstone portions relate to nomenclature commonly used to define the geometry of a particular gemstone cut; in any event, the three portions (including an embedded image in any or all of the portions) share the same crystalline structure. The particular shape of the faceted gemstone 142 is not particularly limited, although a characteristic crown angle $\Theta_A$ and a characteristic pavilion angle $\Theta_B$ (e.g., angles defined by crown 142A and pavilion 142B sidewalls relative to the girdle 142C plane) are suitably selected to attain total internal reflection of incident light to a viewer (e.g., reflection back through the crown 142A) and enhance the brilliance of the gemstone 142. As illustrated, the crown 142A and the pavilion 142B each have five facets (i.e., four sloped sidewalls and a top surface of a truncated pyramid). In general, however, the crown 142A, pavilion 142B, and girdle 142C portions can each have an independently selected number of facets such as at least 4, 6, 8, 10, 12, 16, 20, 24, 30, or 40 facets and/or up to 6, 8, 10, 12, 16, 20, 24, 30, 40, 50, 60, 80, or 100 facets. Alternatively or additionally, the gemstone 142 can be characterized in terms of its total number of facets (e.g., including all three portions or excluding the girdle portion even if present (but which can be faceted)), for example having as at least 8, 10, 12, 16, 20, 30, 40 or 50 facets and/or up to 10, 12, 16, 20, 30, 40, 50, 60, 80, 100, 150, or 200 facets.

EXAMPLES

The following prospective examples illustrate the disclosed compositions (i.e., multicolored single crystal gemstones) and related methods for forming the same, but are not intended to limit the scope of any claims thereto.

Example 1

An example process flow for producing the diamond gemstone 142 with an image 126 inside is shown in FIG. 1 (e.g., where the embedded image has a thin rectangular shape). The process starts with a single crystal diamond seed 100. On this seed 100 is grown a PACVD diamond layer 110 of a first color (e.g., colorless diamond). Next, a pattern 116 is etched in the diamond layer 110 by using plasma-assisted etching. This is done by depositing a hard-mask material (e.g., such as aluminum, gold, silicon dioxide or silicon nitride; not shown) on the diamond layer 110, which hard mask is patterned using standard photolithography and microfabrication etching techniques. Then a plasma-assisted etching of the diamond is done to form the trench pattern 116 in the diamond as shown in Step 3 forming an etched first layer 110'. Then in Step 4 a second layer 120 of diamond of a second color (e.g., colored or otherwise different from the first color; deposited with a PACVD process including an impurity to provide the second color) is deposited that fills the trench 116. Next in Step 5 the diamond is polished back to a smooth surface and the composite diamond structure 140 is pretreated (e.g., chemical and/or plasma cleaning as described in U.S. Publication Nos. 2009/0239078 and 2010/0034984) to prepare for additional diamond deposition. Next in Step 6 an additional layer 130 of diamond of a third color (e.g., colorless or otherwise the same as the first color) is deposited. At this point in the fabrication process, the colored patterned diamond 126 forming the desired image is embedded in the grown single crystal diamond 140. In Step 7, the diamond 140 is cut and polished into the final desired gemstone shape 142. As indicated above, this general process could be extended to multiple colored layers.

Example 2

Another fabrication process for producing the diamond gemstone 142 with an image 110' is illustrated in FIG. 2 for cases where other colors of diamond are desired (e.g., colors other than those obtainable with inclusion of an impurity dopant in the PACVD process). Such other colors (e.g., pink, red, green) are often formed by a method such as irradiation treatment of diamond. A representative flow diagram for the process is shown in FIG. 2. The process starts with a single crystal diamond seed/substrate 110. This diamond seed 110 is treated in some manner (e.g., irradiated) in Step 2 to create the first diamond layer 110 having a first color (e.g., non-colorless). Next in Step 3, a PACVD second diamond layer 120 of a second color (e.g., colorless diamond or otherwise difference from the first color) is grown on the colored seed 110. Next a pattern is etched in the colored diamond layer 110 by using plasma-assisted etching to form a patterned diamond layer 110' corresponding to the desired image (e.g., as shown in Step 4 where the composite diamond 110/120 has been turned up-side-down). This is done by depositing a hard-mask material (e.g., aluminum, gold, silicon dioxide or silicon nitride; not shown) on the diamond which is patterned using standard photolithography and microfabrication etching techniques. Then a plasma-assisted etching of the diamond layer 110 is done to form the patterned diamond layer 110' in the composite diamond as shown in Step 4. Next in Step 5 an additional layer 130 of diamond of a third color (e.g., colorless or otherwise the same as the second color) is deposited. At this point in the fabrication process, the colored patterned diamond layer 110' is embedded in the grown single crystal diamond 140. In Step 6, the diamond 140 is cut and polished into the final desired gemstone shape 142. As indicated above, this general process could be extended to multiple colored layers.

Examples 3 and 4

Example 3 and the corresponding FIG. 3 illustrate a variant of Example 1 in which the deposition of the third diamond layer 130 is omitted when forming the grown single crystal diamond 140. As a result, the embedded image 126 is located at an external surface of the final gemstone 142.

Example 4 and the corresponding FIG. 4 illustrate a variant of Example 2 in which the deposition of the third diamond layer 130 is omitted when forming the grown single crystal diamond 140. As a result, the image 110' is located at an external surface of the final gemstone 142.

A potential advantage of positioning the patterned diamond layer forming the image at an external surface as shown in Examples 3 and 4 is the ability to polish the layer 126/110' if it has flaws. Then the underlying diamond can still be used again for the deposition of a new colored layer that can then be patterned.

Example 5

Another fabrication process for producing the diamond gemstone 142 with an image 110' is illustrated in FIG. 5. The process begins with a colored diamond gemstone 110 which will become the colored layer that is patterned. A natural or lab-grown diamond gemstone 110 of the desired color would first be cut so that the orientation of the crystal is such that a (100) surface is formed as top growth surface 112. The (100) surface is desirable for improving the growth rate and quality of single crystal diamond on the single crystal diamond substrate 110. Next in Step 3, a second PACVD diamond layer of a second color (e.g., colorless or otherwise different from the color of the gemstone 110) is grown on the colored seed crystal 110. Next a pattern 110' is etched in the colored diamond layer 110 by using plasma-assisted etching as shown in Step 4 where the diamond has been turned up-side-down. As in the previous examples, this is performed with a hard mask, photolithography, and microfabrication etching techniques. In Step 5, the diamond 140 is cut and polished into the final desired gemstone shape 142.

Example 6

When the colored layer pattern is on the top, it is possible to remove the etched pattern (e.g., by polishing or etching it away) and then to put on a new pattern. For example, a gemstone signifying marriage with two interlocked hearts (e.g., two separate but partially overlapping embedded images) could be returned and modified at a later time to show additional smaller hearts to indicate the children of the family.

Figure 6:
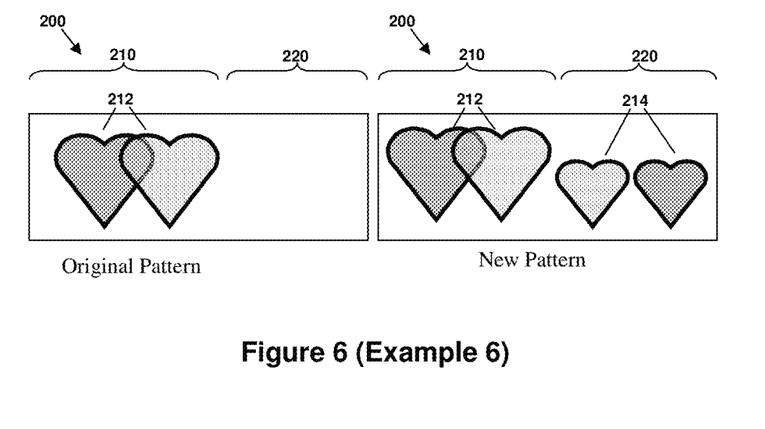
FIG. 6 shows a top view of a process to modify a gemstone matrix having an embedded image to impart an additional image into the matrix.

FIG. 6 more generally illustrates a method in which a multicolored SCD gemstone 200 containing one or more pre-existing embedded diamond images 212 can be subsequently modified to add additional images, regardless of whether the existing images are at the gemstone surface or in the gemstone interior. This is analogous to the foregoing methods in a situation where the first SCD layer 110 includes an additional SCD layer corresponding to an existing image embedded therein and having a color different from the first color. With reference to FIG. 6, the multicolored SCD gemstone 200 includes a first (e.g., left side) portion 210 including the pre-existing SCD images 212 and a second (e.g., right side) portion 220 where one or more new SCD images 214 are to be formed. A hard mask (not shown) can be deposited over the first portion 210, and the second portion 220 can be etched, patterned, and deposited with new SCD layers (colored or colorless) according to the general processes described above to form the one or more new SCD images 214.

Examples 7 and 8

Example 7 and the corresponding FIG. 7 illustrate a variant of Example 1 in which the deposition of the hard mask 150

(Step 3) and etching of the first layer 110 to form the cavity 116 (Step 4) is shown. In this example, the hard mask 150 is not removed during the deposition of second layer 120 into the recess 116 forming the grown single crystal diamond 140 as shown in Step 5. The hard mask is then removed in Step 6. As a result, the embedded image 126 which remains after the hard mask 150 is removed is located at an external surface of the final gemstone 142.

Example 8 and the corresponding FIG. 8 illustrate a variant of Example 7 in which the deposition of the third diamond layer 130 is included and deposited within the cavity 116 prior to removal of the hard mask 150. In this example, the image 126 is embedded within the SCD composite and visible through the first layer 110' and third layer 130.

Because other modifications and changes varied to fit particular operating requirements and environments will be apparent to those skilled in the art, the disclosure is not considered limited to the examples chosen for purposes of illustration, and covers all changes and modifications which do not constitute departures from the true spirit and scope of this disclosure.

Accordingly, the foregoing description is given for clarity of understanding only, and no unnecessary limitations should be understood therefrom, as modifications within the scope of the disclosure may be apparent to those having ordinary skill in the art.

Throughout the specification, where the compositions, processes, or apparatus are described as including components, steps, or materials, it is contemplated that the compositions, processes, or apparatus can also comprise, consist essentially of, or consist of, any combination of the recited components or materials, unless described otherwise. Component concentrations expressed as a percent are weight-percent (% w/w), unless otherwise noted. Numerical values and ranges can represent the value/range as stated or an approximate value/range (e.g., modified by the term "about"). Combinations of components are contemplated to include homogeneous and/or heterogeneous mixtures, as would be understood by a person of ordinary skill in the art in view of the foregoing disclosure.

REFERENCES

1. Asmussen et al. U.S. Publication No. 2009/0239078 ("Process and apparatus for diamond synthesis").
2. Asmussen et al. U.S. Publication No. 2010/0034984 ("Microwave plasma reactors").
3. T. W. Overton and J. E. Shigley, "A History of Diamond Treatments," *Gems and Gemology*, Spring 2008, p. 32-52, 2008.
4. D. T. Tran, T. A. Grotjohn, D. K. Reinhard and J. Asmussen, "Microwave plasma-etching of diamond", *Diamond and Related Materials*, 17, 717-721, 2008.
5. D. T. Tran, C. Fansler, T. A. Grotjohn, D. K. Reinhard and J. Asmussen, "Investigation of mask selectivities and diamond etching using microwave plasma-assisted etching," *Diamond and Related Materials*, 19, 778-782, 2010.
6. J. Asmussen, T. A. Grotjohn, T. Schuelke, M. Becker, M. Yaran, D. King, S. Wicklein, and D. K. Reinhard, "Multiple substrate microwave plasma-assisted chemical vapor deposition single crystal diamond synthesis," Applied Physics Letters, 93, 031502-1, 2008.
7. J. Asmussen, J. Lu, G. Yajun, T. A. Grotjohn, D. K. Reinhard T. Schuelke, and Kagan Yaran, "The experimental performance of microwave plasma-assisted reactors at high pressures and high power densities", Fall 2010 MRS Meeting, Boston, Mass. Nov. 29-Dec. 2, 2010.
8. R. Ramamurti, T. A. Grotjohn, D. K. Reinhard and J. Asmussen, "Synthesis of boron-doped homoepitaxial single crystal diamond by microwave plasma chemical vapor deposition," Diamond and Related Materials, 17, 1320-1323, 2008.

What is claimed is:

1. A method for forming a multicolored single crystal gemstone (SCG) structure, the method comprising:
    (a) providing a first SCG layer having (i) a growth surface and (ii) a first color;
    (b) removing a portion of the first SCG layer from the growth surface thereof, thereby forming a recess in the first SCG layer;
    (c) depositing a second SCG layer into the recess and onto the growth surface of the first SCG layer, the second SCG layer having a second color different from the first color;
    (d) removing a portion of the second SCG layer so that at least a portion of the second SCG layer remains in the recess as a patterned second SCG layer, thereby forming a multicolored SCG composite structure;
    (e) depositing a third SCG layer having a third color above the patterned second SCD layer, thereby enlarging the multicolored SCG composite structure; and
    (f) reshaping the multicolored SCG composite structure into a gemstone shape;
    wherein the first SCG layer, the second SCG layer, and the third SCG share the same single crystal structure,
    wherein depositing the second SCG layer and depositing the third SCG layer comprises performing single crystal homoepitaxial deposition of the second SCG layer and the third SCG layer.

2. The method of claim 1 wherein the SCG is single crystal diamond (SCD).

3. The method of claim 1, wherein the first SCG layer comprises an additional SCG layer embedded therein and having a color different from the first color.

4. The method of claim 1, wherein depositing any of the SCG layers comprises performing a chemical vapor deposition (CVD) process.

5. The method of claim 1, wherein the colors of any of the SCG layers are independently selected from colorless, a color resulting from a deposition process including an impurity, and a color resulting from an irradiation process.

6. The method of claim 1, wherein the recess and the resulting patterned second SCG layer have a shape selected from the group consisting of letters, numbers, words, symbols, and combinations thereof.

7. The method of claim 1, wherein removing a portion of the first SCG layer comprises performing an etching process on the first SCG layer, the etching process comprising:
    (i) depositing a hard mask on a portion of the growth surface of the first SCG layer;
    (ii) patterning the hard mask with a shape corresponding to the intended shape of the recess;
    (iii) etching the first SCG layer through the patterned hard mask to form the recess; and
    (iv) removing the hard mask.

8. The method of claim 7 further comprising depositing the second SCG layer in the recess and optionally depositing a fourth SCG layer with a fourth color in the recess prior to removing the hard mask.

9. The method of claim 1 comprising removing in part (d) the portion of the second SCG layer deposited on the growth surface of the first SCG layer by one or more of polishing and etching the second SCG layer.

10. The method of claim 1, wherein reshaping the multicolored SCG composite structure into a gemstone shape comprises one or more of cutting and polishing the multicolored SCG composite structure to form the gemstone shape.

11. A method for forming a multicolored single crystal gemstone (SCG) structure, the method comprising:
(a) providing a first SCG layer having (i) a growth surface and (ii) a first color;
(b) depositing a second SCG layer onto the growth surface of the first SCG layer, the second SCG layer having a second color different from the first color;
(c) removing a portion of either the first SCG layer or the second SCG layer to form a patterned first SCG layer or a patterned second SCG layer from the remaining layer material, thereby forming a multicolored SCG composite structure;
(d) depositing a third SCG layer having a third color above the patterned first SCG layer or the patterned second SCG layer, thereby enlarging the multicolored SCG composite structure; and
(e) reshaping the multicolored SCG composite structure into a gemstone shape;
wherein the first SCG layer, the second SCG layer, and the third SCG share the same single crystal structure,
wherein depositing the second SCG layer and depositing the third SCG layer comprises performing single crystal homoepitaxial deposition of the second SCG layer and the third SCG layer.

12. The method of claim 11, wherein the SCG is single crystal diamond (SCD).

13. The method of claim 11, wherein the first SCG layer comprises an additional SCG layer embedded therein and having a color different from the first color.

14. The method of claim 11, wherein the colors of any of the SCG layers are independently selected from colorless, a color resulting from a deposition process including an impurity, and a color resulting from an irradiation process.

15. The method of claim 11, wherein the recess and the resulting patterned second SCG layer have a shape selected from the group consisting of letters, numbers, words, symbols, and combinations thereof.

16. The method of claim 15, wherein part (c) comprises removing a portion of the first SCG layer or second SCG layer by etching a bottom surface of the first SCG layer or a top surface of the second SCG layer to form the patterned first SCG layer or to form the patterned second SCG layer and to expose a portion of the first SCG layer or the second SCG layer respectively.

17. The method of claim 1, wherein the second SCG layer defines an image externally visible with respect to the SCG gemstone, the image having a shape selected from the group consisting of letters, numbers, words, symbols, and combinations thereof.

18. The method of claim 11 comprising:
removing in part (c) the portion of the first SCG layer to form the patterned first SCG layer from the remaining layer material, thereby forming the multicolored SCG composite structure.

19. The method of claim 11 comprising:
removing in part (c) the portion of the second SCG layer to form the patterned second SCG layer from the remaining layer material, thereby forming the multicolored SCG composite structure.

20. The method of claim 11, wherein the second SCG layer defines an image externally visible with respect to the SCG gemstone, the image having a shape selected from the group consisting of letters, numbers, words, symbols, and combinations thereof.

* * * * *